US008513619B1

(12) United States Patent
Nasser-Ghodsi et al.

(10) Patent No.: US 8,513,619 B1
(45) Date of Patent: Aug. 20, 2013

(54) NON-PLANAR EXTRACTOR STRUCTURE FOR ELECTRON SOURCE

(75) Inventors: Mehran Nasser-Ghodsi, Hamilton, MA (US); Tomas Plettner, San Ramon, CA (US); Robert G. Haynes, Pleasanton, CA (US); Christopher Malcolm Stanley Sears, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 13/468,553

(22) Filed: May 10, 2012

(51) Int. Cl.
*H01J 37/04* (2006.01)
*H01J 37/26* (2006.01)
*H01J 27/02* (2006.01)

(52) U.S. Cl.
CPC ............... *H01J 37/04* (2013.01); *H01J 27/024* (2013.01)
USPC ...... 250/397; 250/396 R; 250/398; 250/492.3; 250/310; 250/251

(58) Field of Classification Search
CPC .............. H01J 2237/083; H01J 27/024; H01J 2235/068; H01J 2237/0458
USPC ................. 250/396 R, 492.3, 251, 281, 310, 250/397, 398
See application file for complete search history.

(56) References Cited

U.S. PATENT DOCUMENTS

| 4,146,811 | A | * | 3/1979 | Tran et al. ....................... 313/62 |
| 4,912,367 | A | * | 3/1990 | Schumacher et al. ......... 315/3.5 |
| 5,256,931 | A | | 10/1993 | Bernadet |
| 5,350,926 | A | * | 9/1994 | White et al. .............. 250/492.21 |
| 5,517,084 | A | | 5/1996 | Leung |
| 6,181,307 | B1 | | 1/2001 | Beeteson et al. |
| 6,376,983 | B1 | | 4/2002 | Beeteson et al. |
| 6,392,333 | B1 | * | 5/2002 | Veneklasen et al. ....... 313/361.1 |
| 6,771,012 | B2 | | 8/2004 | Ahmed et al. |
| 7,372,195 | B2 | * | 5/2008 | Coyle et al. ................. 313/363.1 |
| 7,732,764 | B2 | * | 6/2010 | Fujieda et al. ................ 250/310 |
| 7,809,114 | B2 | * | 10/2010 | Zou et al. ...................... 378/134 |
| 7,826,594 | B2 | * | 11/2010 | Zou et al. ......................... 378/92 |
| 7,847,273 | B2 | * | 12/2010 | Nguyen et al. ............. 250/493.1 |
| 7,915,597 | B2 | * | 3/2011 | Huang et al. .............. 250/396 R |
| 2002/0043621 | A1 | * | 4/2002 | Aitken .......................... 250/281 |
| 2002/0102753 | A1 | * | 8/2002 | Johnson et al. ................. 438/20 |
| 2004/0159538 | A1 | * | 8/2004 | Becker et al. ........... 204/192.11 |
| 2006/0272775 | A1 | * | 12/2006 | Horsky et al. ............ 156/345.37 |
| 2007/0108395 | A1 | * | 5/2007 | Horsky et al. ................. 250/489 |

* cited by examiner

*Primary Examiner* — David A Vanore
(74) *Attorney, Agent, or Firm* — Okamoto & Benedicto LLP

(57) ABSTRACT

One embodiment disclosed relates to an electron source for generating an electron beam. The electron source includes an electron emitter having a tip from which an electron beam is extracted. The electron further includes a non-planar extractor with an extractor opening and a built-in beam-limiting aperture. The extractor opening is larger than the beam-limiting aperture, and central axes of both the extractor opening and the beam-limiting aperture are aligned with the tip along a beam axis. Another embodiment relates to a method of generating an electron beam using an electron source having a non-planar extractor. Another embodiment relates to an array of electron sources for generating an array of electron beams. The array of electron sources includes an array of electron emitters and an array of non-planar extractor structures. Other embodiments, aspects and features are also disclosed.

17 Claims, 4 Drawing Sheets

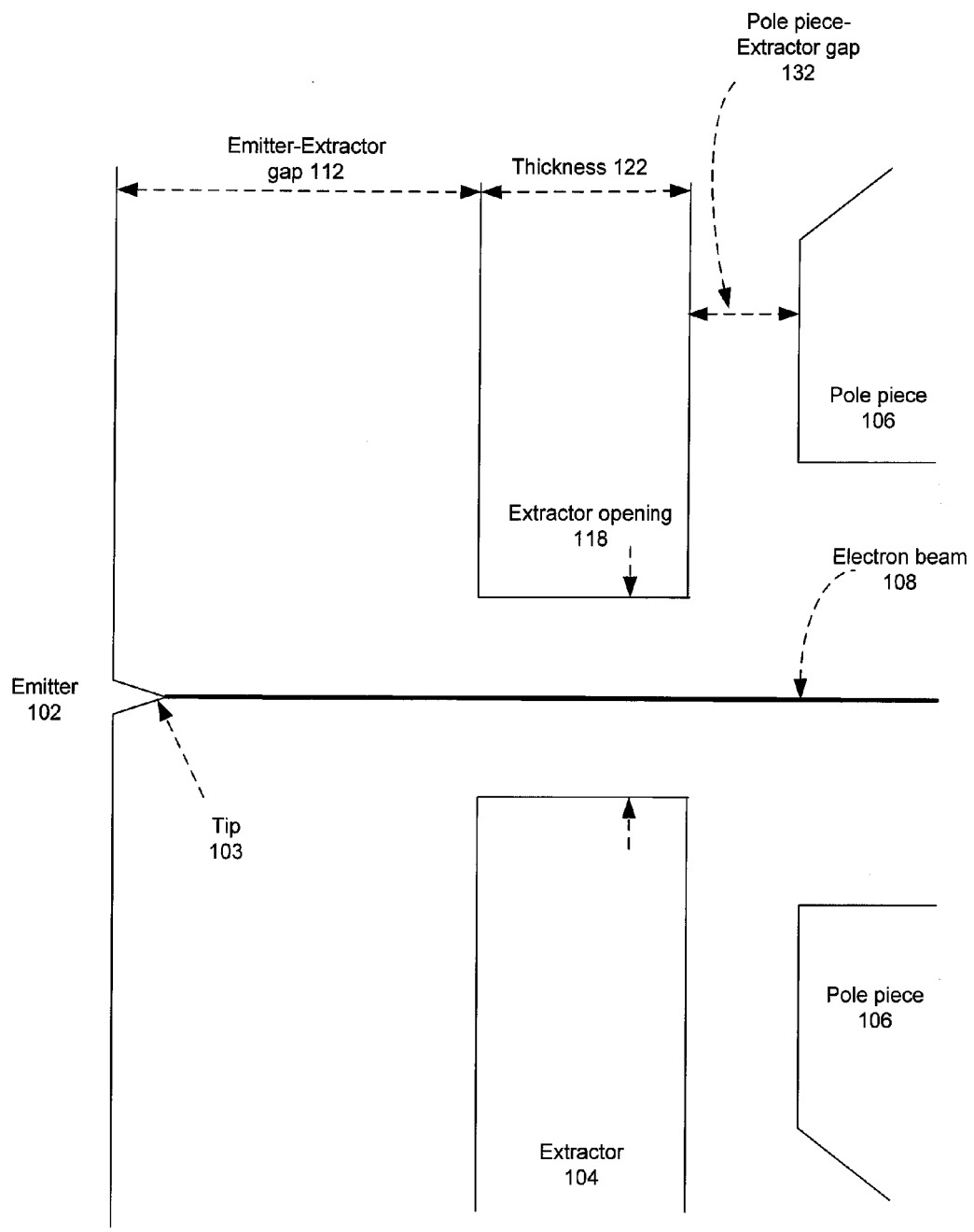
FIG. 1
(Conventional)

| 402 | 402 | 402 | 402 | 402 | 402 |

*FIG. 4*     400

| 502 | 502 | 502 | 502 | 502 |
|---|---|---|---|---|
| 502 | 502 | 502 | 502 | 502 |
| 502 | 502 | 502 | 502 | 502 |
| 502 | 502 | 502 | 502 | 502 |
| 502 | 502 | 502 | 502 | 502 |

*FIG. 5*     500

NON-PLANAR EXTRACTOR STRUCTURE FOR ELECTRON SOURCE

BACKGROUND OF THE INVENTION

1. Field of the Invention

The present invention relates generally to electron beam apparatus and methods of using same.

2. Description of the Background Art

Electron beam apparatus include scanning electron microscope (SEM) instruments, such as those used in automated inspection and review of manufactured substrates, electron beam lithography systems, and other apparatus that use electron beam technology. Such electron beam apparatus generally generate one or more beams of electrons using an electron source or an array of electron sources.

BRIEF DESCRIPTION OF THE DRAWINGS

FIG. 1 is a cross-sectional diagram of an electron source with a conventional planar extractor.

FIG. 4 is a planar diagram of a one-dimensional array of electron sources in accordance with an embodiment of the invention.

FIG. 5 is a planar diagram of a two-dimensional array of electron sources in accordance with an embodiment of the invention.

SUMMARY

Figure 2:
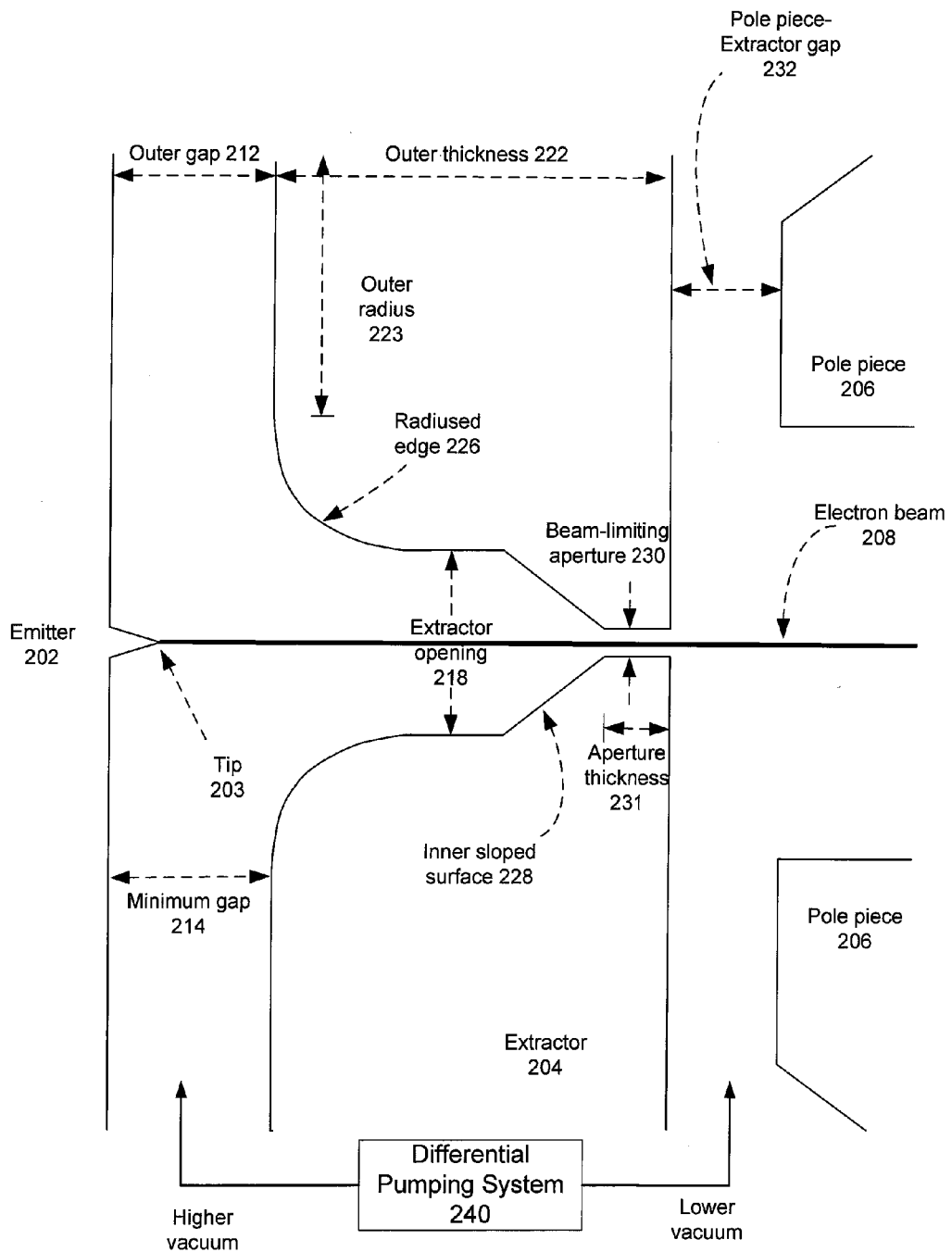
FIG. 2 is a cross-sectional diagram of an electron source with a non-planar extractor having a built-in beam-limiting aperture in accordance with an embodiment of the invention.

One embodiment disclosed relates to an electron source for generating an electron beam. The electron source includes an electron emitter having a tip from which an electron beam is extracted. The electron source further includes a non-planar extractor with an extractor opening and a built-in beam-limiting aperture. The extractor opening is larger than the beam-limiting aperture, and central axes of both the extractor opening and the beam-limiting aperture are aligned with the tip along a beam axis.

Another embodiment relates to a method of generating an electron beam using an electron source having a non-planar extractor. The electron beam is travels through both an extractor opening and a beam-limiting aperture of the non-planar extractor Another embodiment relates to an array of electron sources for generating an array of electron beams. The array of electron sources includes an array of electron emitters and an array of non-planar extractor structures.

Other embodiments, aspects and features are also disclosed.

DETAILED DESCRIPTION

FIG. 1 is a cross-sectional diagram of an electron source 100 with a conventional planar extractor 104. The electron source 102 is radially symmetric around the beam axis of the electron beam 108, such that the cross-sectional diagram is through a diameter of the electron source 100.

As shown in FIG. 1, the source 100 includes an emitter 102 that has a tip 103 from which an electron beam 108 is emitted. The electron beam 108 is transmitted through an extractor opening 118 of the planar extractor 104. As further shown, the planar extractor 104 has a uniform thickness 122. There is an emitter-extractor gap 112 between a plane of the emitter 102 and the planar extractor 104.

After passing through the extractor opening 130, the electron beam 108 may be focused by the pole piece 106 of a magnetic lens. As depicted in FIG. 1, there is a pole piece-extractor gap 132 between the planar extractor 104 and the pole piece 106.

Applicants have determined a few disadvantages of the structure of the conventional electron source 100. First, the relatively large trapped volume in the structure results in a relatively poor vacuum in the emitter region. In addition, angular beam filtering, which is typically necessary for most sources, has to occur in a separate module (not shown) which is further down in the column.

FIG. 2 is a cross-sectional diagram of an electron source 200 with a non-planar extractor 204 having a built-in beam-limiting aperture 230 in accordance with an embodiment of the invention. The electron source 202 is radially symmetric around the beam axis of the electron beam 208, such that the cross-sectional diagram is through a diameter of the electron source 200.

As shown in FIG. 2, the source 200 includes an emitter 202 that has a tip 203 from which an electron beam 208 is emitted. The tip 203 of the emitter 202 may be formed, for example, using tungsten (W), tungsten with a layer of zirconium oxide (ZrO/W), or carbon nanotubes.

The electron beam 208 is transmitted through a larger cylindrical extractor opening 218 and through a smaller cylindrical beam-limiting aperture 230 of the non-planar extractor 204, where a central axis of both the extractor opening 218 and the beam-limiting aperture 230 are aligned with the tip 203 of the emitter 202. The non-planar extractor 204 may be formed, for example, using gold or another conductive non-magnetic metal or alloy. Use of a magnetic metal or alloy for the non-planar extractor 204 may also be possible.

As further shown, the beam-limiting aperture 230 of the non-planar extractor 204 has an aperture thickness 231 at the beam-limiting aperture 230 which is substantially less than an outer thickness 222 at an outer radius 223. There is an outer gap 212 between a plane of the emitter 202 and the outer radius 223 of the non-planar extractor 204.

The transition between the outer radius 223 and the extractor opening 218 may include a rounded or radiused edge 226. The transition between the extractor opening 218 and the beam-limiting aperture 230 may include an inner sloped surface 228 of the non-planar extractor 204.

After being angularly limited by the beam-limiting aperture 230, the electron beam 208 may be focused by the pole piece 206 of a magnetic gun lens. As depicted in FIG. 2, there is a pole piece-extractor gap 232 between the non-planar extractor 204 and the pole piece 206.

As further depicted in FIG. 2, a differential pumping system 240 may be configured so as to pump the volume between the emitter 202 and the extractor 204 to a higher vacuum (lower pressure) while the volume on the other side of the extractor 204 is pumped to a lower vacuum. Such differential pumping is more effective with the non-planar extractor 204 in comparison to the conventional planar extractor 104.

Advantageously, the structure of the electron source 200 in FIG. 2 also provides a beam-limiting aperture 230 to filter the angular trajectories of the electrons in the beam in close proximity to the emitter 202. In addition, the structure of the electron source 200 in FIG. 2 may be implemented with an extractor geometry that is separate from the emitter to allow for modular construction for easy replacement of components such as the emitter 102. Furthermore, the structure of the electron source 200 in FIG. 2 allows for high vacuum in the vicinity of the tip 203 of the emitter 202.

Figure 3:
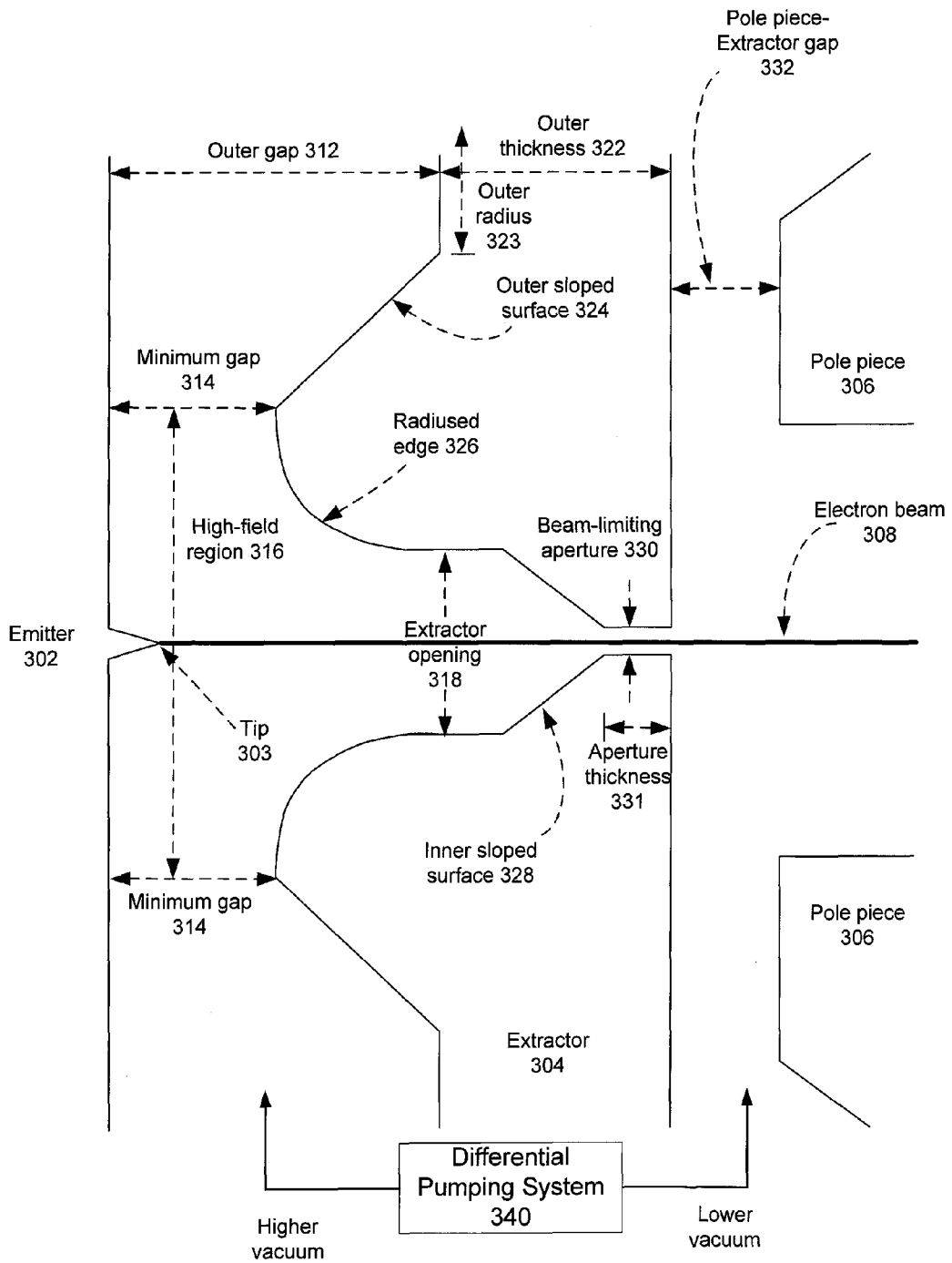
FIG. 3 is a cross-sectional diagram of an electron source with a "volcano-shaped" extractor having a built-in beam-limiting aperture in accordance with another embodiment of the invention.

FIG. 3 is a cross-sectional diagram of an electron source 300 with a non-planar "volcano-shaped" extractor 304 having a built-in beam-limiting aperture 330 in accordance with another embodiment of the invention. The electron source 302 is radially symmetric around the beam axis of the electron beam 308, such that the cross-sectional diagram is through a diameter of the electron source 300.

As shown in FIG. 3, the source 300 includes an emitter 302 that has a tip 303 from which an electron beam 308 is emitted. The tip 303 of the emitter 302 may be formed, for example, using tungsten (W), tungsten with a layer of zirconium oxide (ZrO/W), or carbon nanotubes.

The electron beam 308 is transmitted through a larger cylindrical extractor opening 318 and through a smaller cylindrical beam-limiting aperture 330 of the volcano-shaped extractor 304, where a central axis of both the extractor opening 318 and the beam-limiting aperture 330 are aligned with the tip 303 of the emitter 302. The volcano-shaped extractor 304 may be formed, for example, using gold or another conductive non-magnetic metal or alloy. Use of a magnetic metal or alloy for the volcano-shaped extractor 304 may also be possible.

As further shown, the beam-limiting aperture 330 of the volcano-shaped extractor 304 has an aperture thickness 331 at the beam-limiting aperture 330 which is substantially less than an outer thickness 322 at an outer radius 323. There is an outer gap 312 between a plane of the emitter 302 and the outer radius 323 of the volcano-shaped extractor 304.

The transition between the outer radius 323 and the extractor opening 318 may include an outer sloped surface 324 followed by a rounded or radiused edge 326. The transition between the extractor opening 318 and the beam-limiting aperture 330 may include an inner sloped surface 328 of the extractor 304.

In accordance with an embodiment of the invention, there may be a minimum gap 314 between a circle formed at an outer radial extent of the rounded or radiused edge 326 and the plane of the emitter 302. A high-field region 316 is formed within a cylindrical volume defined by the minimum gap 314 which includes the tip 303 of the emitter 302 therein.

After being angularly-limited by the beam-limiting aperture 330, the electron beam 308 may be focused by the pole piece 306 of a magnetic lens. As depicted in FIG. 3, there is a pole piece-extractor gap 332 between the volcano-shaped extractor 304 and the pole piece 306.

As further depicted in FIG. 3, a differential pumping system 340 may be configured so as to pump the volume between the emitter 302 and the extractor 304 to a higher vacuum (lower pressure) while the volume on the other side of the extractor 304 is pumped to a lower vacuum. Such differential pumping is more effective with the non-planar extractor 304 in comparison to the conventional planar extractor 104.

Advantageously, the structure of the volcano-shaped electron source 300 in FIG. 3 provides a substantially enhanced local extraction field for a small emitter or for each emitter in a MEMS (micro electro mechanical system) based emitter array. In addition, the structure of the electron source 300 in FIG. 3 allows for high vacuum in the vicinity of the tip 303 of the emitter 302.

The structure of the electron source 300 in FIG. 3 also provides a beam-limiting aperture 330 to filter the angular trajectories of the electrons in the beam in close proximity to the emitter 302. In addition, the structure of the electron source 300 in FIG. 3 may be implemented with an extractor geometry that is separate from the emitter to allow for modular construction for easy replacement of components such as the emitter 302.

FIG. 4 is a planar diagram of a one-dimensional array 400 of electron sources 402 in accordance with an embodiment of the invention. In one implementation, the array 400 of electron sources 402 may be formed using micro-electrical mechanical systems (MEMS) technology. Each electron source 402 in the array 400 may comprise an electron source 200 or 300 as described above.

FIG. 5 is a planar diagram of a two-dimensional array of electron sources in accordance with an embodiment of the invention. In one implementation, the array 500 of electron sources 502 may be formed using MEMS technology. Each electron source 502 in the array 500 may comprise an electron source 200 or 300 as described above.

The above-described diagrams are not necessarily to scale and are intended be illustrative and not limiting to a particular implementation. In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An electron source for generating an electron beam, the electron source comprising:
    an electron emitter having a tip from which an electron beam is extracted; and
    a non-planar extractor comprising an extractor opening and a beam-limiting aperture, wherein the extractor opening is larger than the beam-limiting aperture, and central axes of both the extractor opening and the beam-limiting aperture are aligned with the tip along a beam axis.

2. The electron source of claim 1, further comprising an inner sloped surface between the extractor opening and the beam-limiting aperture.

3. The electron source of claim 1, further comprising a rounded edge between the extractor opening and an outer radius of the non-planar extractor.

4. The electron source of claim 3, wherein a minimum gap between an emitter plane and the non-planar extractor is located at an outer radial extent of the rounded edge.

5. The electron source of claim 3, further comprising an outer sloped surface between the rounded edge and an outer radius of the non-planar extractor such that the non-planar extractor has a volcano shape.

6. The electron source of claim 1 further comprising a differential vacuum pumping system configured to pump a first space between the electron emitter and a first side of the non-planar extractor to a higher vacuum relative to a second space on a second side of the non-planar extractor.

7. A method for generating an electron beam, the method comprising:
   extracting electrons from a tip of an electron emitter using a non-planar extractor so as to form an electron beam; and
   transmitting the electron beam through both an extractor opening and a beam-limiting aperture of the non-planar extractor, wherein central axes of both the extractor opening and the beam-limiting aperture are aligned with the tip along a beam axis.

8. The method of claim 7, wherein the non-planar extractor comprises a volcano-shaped extractor.

9. The method of claim 8, wherein extracting the electrons is performed in a cylindrical high-field region defined by a minimum gap between a plane of the emitter and the volcano-shaped extractor.

10. The method of claim 7, further comprising differential vacuum pumping of a first space between the electron emitter and the non-planar extractor to a higher vacuum relative to a second space on a second side of the non-planar extractor.

11. An array of electron sources for generating an array of electron beams, the array of electron sources comprising:
   an array of electron emitters, each of the electron emitters having a tip from which an electron beam is extracted; and
   an extractor comprising an array of non-planar extractor structures, each of the non-planar extractor structures comprising an extractor opening and a beam-limiting aperture opening, wherein both aligned with a corresponding tip along a beam axis, wherein central axes of both the extractor opening and the beam-limiting aperture are aligned with the tip of a corresponding electron emitter along a beam axis.

12. The array of electron sources of claim 11, wherein the array comprises a one-dimensional array of sources.

13. The array of electron sources of claim 11, wherein the array comprises a two-dimensional array of sources.

14. The array of electron sources of claim 11, wherein each of the non-planar extractor structures further comprises an inner sloped surface between the extractor opening and the beam-limiting aperture.

15. The array of electron sources of claim 11, wherein each of the non-planar extractor structures further comprises a rounded edge between the extractor opening and an outer radius of the non-planar extractor structure.

16. The array of electron sources of claim 15, wherein each of the non-planar extractor structures further comprises an outer sloped surface between the rounded edge and the outer radius such that the non-planar extractor structure has a volcano shape.

17. The array of electron sources of claim 11 further comprising a differential vacuum pumping system configured to pump a first space between the array of electron emitters and a first side of the extractor to a higher vacuum relative to a second space on a second side of the extractor.

* * * * *